(12) United States Patent
Kinouchi

(10) Patent No.: US 8,324,308 B2
(45) Date of Patent: Dec. 4, 2012

(54) RESIN COMPOSITION FOR ENCAPSULATING AN ELECTRONIC TAG, A RESIN-ENCAPSULATED ELECTRONIC TAG AND A METHOD FOR PRODUCING THE SAME

(75) Inventor: Satoru Kinouchi, Ichihara (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 122 days.

(21) Appl. No.: 12/527,434

(22) PCT Filed: Apr. 7, 2008

(86) PCT No.: PCT/JP2008/056860
§ 371 (c)(1),
(2), (4) Date: Aug. 17, 2009

(87) PCT Pub. No.: WO2008/132972
PCT Pub. Date: Nov. 6, 2008

(65) Prior Publication Data
US 2010/0113671 A1 May 6, 2010

(30) Foreign Application Priority Data

Apr. 20, 2007 (JP) ................. 2007-111780

(51) Int. Cl.
*C08K 3/40* (2006.01)

(52) U.S. Cl. ........................................ 524/494

(58) Field of Classification Search .................... 524/494
See application file for complete search history.

(56) References Cited

U.S. PATENT DOCUMENTS

| 5,912,320 A * | 6/1999 | Hotta et al. .................... 528/373 |
| 6,395,818 B1 * | 5/2002 | Murakami et al. ............. 524/492 |

FOREIGN PATENT DOCUMENTS

| EP | 0 246 620 A2 | 11/1987 |
| EP | 0 376 616 A2 | 7/1990 |
| EP | 376616 A2 * | 7/1990 |
| JP | 62-268612 | 11/1987 |
| JP | 2-173047 | 7/1990 |
| JP | 7-81284 | 3/1995 |
| JP | 8-216576 | 8/1996 |
| JP | 2003-268252 | 9/2003 |
| JP | 2004-155928 | 6/2004 |
| JP | 2005-161693 | 6/2005 |
| JP | 2005-332116 | 12/2005 |
| JP | 2005332116 A * | 12/2005 |
| JP | 2006-328291 | 12/2006 |
| JP | 2007-70468 | 3/2007 |
| JP | 2007-211157 | 8/2007 |
| WO | WO 2008/038512 A1 | 4/2008 |

* cited by examiner

*Primary Examiner* — Peter Szekely
(74) *Attorney, Agent, or Firm* — Oblon, Spivak, McClelland, Maier & Neustadt, L.L.P.

(57) ABSTRACT

A resin composition for encapsulating an electronic tag which includes a thermoplastic resin and a flat glass fiber and does not include a thermoplastic elastomer, wherein the thermoplastic resin is at least one selected from polycarbonate, syndiotactic polystyrene and polyphenylene sulfide.

15 Claims, 1 Drawing Sheet

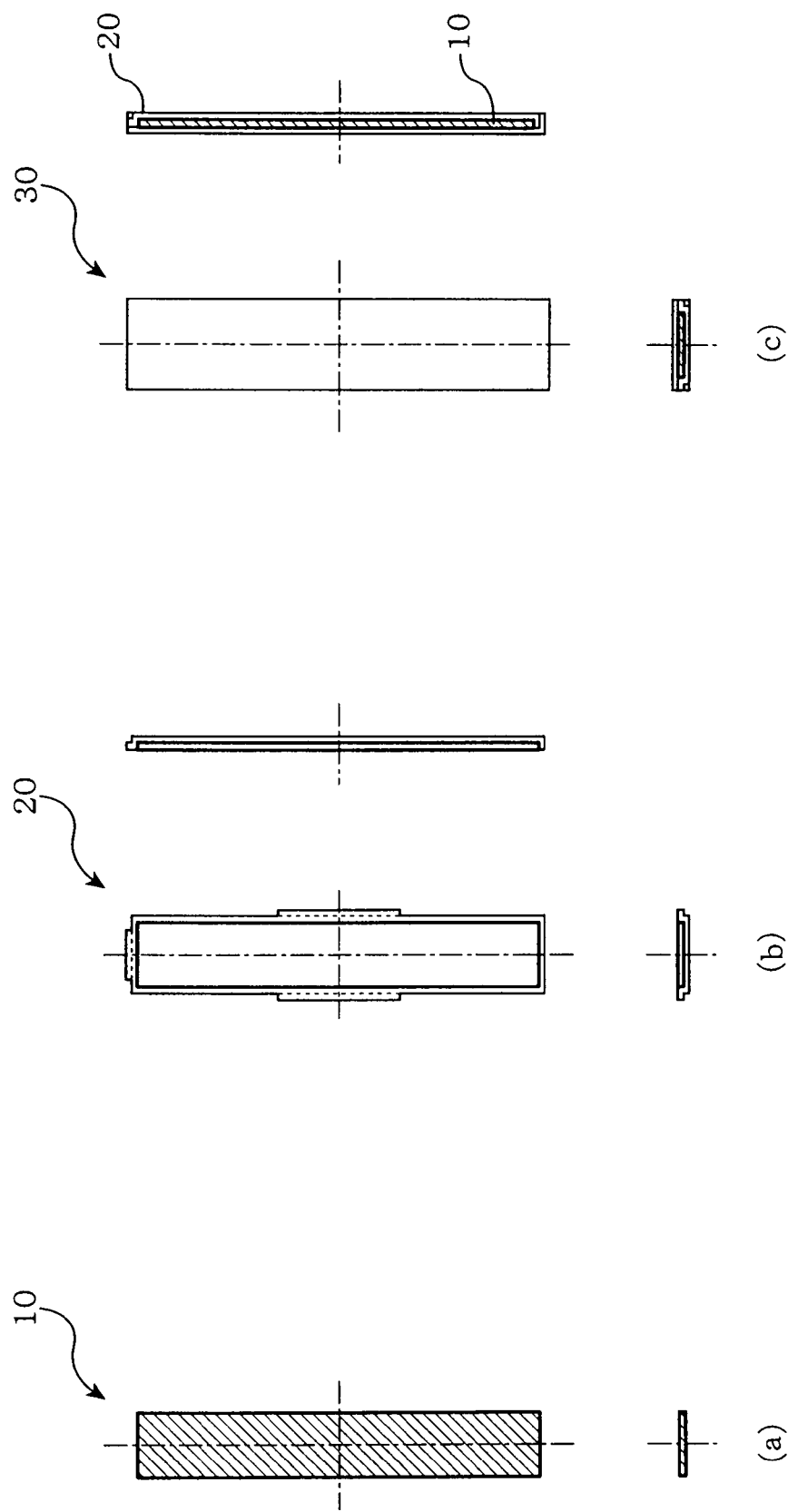

RESIN COMPOSITION FOR ENCAPSULATING AN ELECTRONIC TAG, A RESIN-ENCAPSULATED ELECTRONIC TAG AND A METHOD FOR PRODUCING THE SAME

This application is a 371 of PCT/JP2008/056860, filed Apr. 7, 2008.

TECHNICAL FIELD

The invention relates to a resin composition for encapsulating an electronic tag, a resin-encapsulated electronic tag and a method for producing the same.

BACKGROUND ART

An electronic tag (often referred to as an IC tag, an RFID, a radio tag, and an electronic label) is used in physical distribution, production management or the like since it has an advantage that information can be written to a small IC chip.

An electronic tag has a configuration in which a component called an electronic tag inlet having an IC chip (hereinafter referred to as an inlet) is encapsulated and protected with a resin or the like. For example, Patent Document 1 discloses an electronic tag in which an insulating resin sheathing member is formed by injection molding.

Patent Document 2 discloses an example in which a resin material having a high degree of heat resistance such as PPS is used as a thermoplastic resin.

As the method for molding a resin-encapsulated electronic tag, Patent Document 3 states that it is preferable to perform in-mold processing through a protective layer and to place a gate in the middle of the inlet.

On the other hand, Patent Document 4 or 5 discloses a thermoplastic resin composition significantly improved in dimensional stability which can be obtained by filling glass fibers having a flat cross-sectional shape.

Patent Document 6 discloses a resin composition suitable for insert molding by using a thermoplastic elastomer in combination.

Patent Document 1: JP-A-H07-081284
Patent Document 2: JP-A-H08-216576
Patent Document 3: JP-A-2005-332116
Patent Document 4: JP-A-S62-268612
Patent Document 5: JP-A-2003-268252
Patent Document 6: JP-A-2005-161693

In the encapsulation of an electronic tag in a thermoplastic resin composition, conventional encapsulation of a small-sized coil or an IC card, reliability can be attained to some extent with a resin composition for encapsulating which has conventionally been used.

However, it is known that the following problems (a) to (c) may occur, and hence, improvement has been required.

(a) Generation of warpage: If conventional thermoplastic resin compositions are subjected to two-stage molding, an entire molded product suffers a significant degree of warpage, and a problem may occur in which an electronic tag is lifted when installed in articles such as a merchandise;

(b) Insufficient adhesiveness: If conventional thermoplastic resin compositions are subjected to two-stage molding, adhesion between a primary molded product and a secondary molded product may be insufficient, and water may enter through gaps; and (c) Poor resistance to heat shock: If a heat-resistant film or a glass epoxy substrate is used as a constitution material of an inlet, warpage or opening may occur. In addition, if a resin composition is exposed to thermal stress during molding or a molded product is exposed to thermal stress, large stress is imposed on an inlet.

Therefore, an object of the invention is to provide a resin composition for encapsulating an electronic tag and a resin composition-encapsulated electronic tag which suffers only a slight degree of warpage after molding, exhibits good adhesion between resins in two-stage molding (i.e., exhibits high inlet encapsulation effect), as well as is improved in heat shock resistance.

DISCLOSURE OF THE INVENTION

As a result of intensive studies, the inventors have found that, by adding flat glass fibers to a prescribed thermoplastic resin, it is possible to obtain a resin-encapsulated electronic tag which undergoes a slight degree of warpage and is improved in adhesion and reliability.

According to the invention, the following resin composition for encapsulating an electronic tag or the like can be provided.

1. A resin composition for encapsulating an electronic tag which comprises a thermoplastic resin and a flat glass fiber and does not comprise a thermoplastic elastomer, wherein the thermoplastic resin is at least one selected from polycarbonate, syndiotactic polystyrene and polyphenylene sulfide.

2. A resin composition for encapsulating an electronic tag according to 1, wherein the thermoplastic resin is polyphenylene sulfide and the crystallization temperature during cooling thereof measured by the differential scanning calorimetry (DSC) is 230° C. or higher.

3. A resin composition for encapsulating an electronic tag according to 1 or 2, which comprises 100 parts by mass of the thermoplastic resin, 10 to 200 parts by mass of the flat glass fiber and 0 to 200 parts by mass of an inorganic filler.

4. A resin composition for encapsulating an electronic tag according to any one of 1 to 3, wherein the oblateness (the short axis/the major axis of a cross section) of the flat glass fiber is ½ to ⅒.

5. A resin composition for encapsulating an electronic tag according to 3 or 4, wherein the inorganic filler is at least one selected from calcium carbonate, mica, talc and silica.

6. An electronic tag which comprises the resin composition for encapsulating an electronic tag according to any one of 1 to 5 and an electronic tag inlet.

7. A method for producing an electronic tag which comprises the steps of:
molding the resin composition according to any one of 1 to 5 to form a primary molded product;
combining an electronic tag inlet with the primary molded product; and
encapsulating the electronic tag inlet with the resin composition.

The invention can provide an electronic tag which undergoes only a slight degree of warpage, is improved in inlet encapsulating property and can attain inlet protection effects against a thermal stress.

BRIEF DESCRIPTION OF THE DRAWINGS

FIG. 1 is a view showing one embodiment of an electronic tag of the invention, in which (a) are a top view and a lateral cross-sectional view of an inlet; (b) are a top view and a lateral/longitudinal cross-sectional views of a primary molded product; and (c) are a top view and a lateral/longitudinal cross-sectional views of a finished electronic tag.

BEST MODE FOR CARRYING OUT THE INVENTION

The resin composition for encapsulating an electronic tag of the invention is characterized in that it comprises a thermoplastic resin and a flat glass fiber, and that it does not comprise a thermoplastic elastomer. By using a composition obtained by incorporating flat glass fibers into a thermoplastic resin as an encapsulating material of an electronic tag, warpage of an electronic tag after encapsulating an inlet can be suppressed, whereby encapsulating properties between an inlet and an encapsulating material can be improved.

The resin composition of the invention does not comprise a thermoplastic elastomer. If the resin composition of the invention comprises a thermoplastic elastomer, adhesiveness between a primary molded product and a secondary molded product in two-stage molding is lowered, whereby inlet encapsulating capability is lowered.

As the thermoplastic elastomer, an olefin-based elastomer such as an ethylene-glycidyl dimethacrylate copolymer, a polyamide-based elastomer, a polyester-based elastomer, a vinyl copolymer-based elastomer, a diene-based elastomer, and a silicon-based elastomer can be given.

As the thermoplastic resin, polycarbonate (PC), syndiotactic polystyrene (SPS) and polyphenylene sulfide (PPS) can be used. If they are used, performance can be maintained if exposed to high temperatures exceeding 100° C. In particular, PPS or SPS is preferable since it is improved in chemicals resistance.

If PPS is used, in respect of adhesiveness of the resin composition, it is preferred that the crystallization temperature during cooling of the resin composition measured by the differential scanning calorimetry (DSC) be 230° C. or more, with 230 to 240° C. being particularly preferable. Here, the crystallization temperature during cooling is a temperature at which a crystallization peak appears, which is measured at a condition of −20° C. per minute after heating a sample to 340° C. at a rate of 20° C. per minute and leaving it at 340° C. for 5 minutes.

In order to allow the crystallization temperature during cooling to be 230° C. or more, the molecular weight or the cross-linking degree of PPS and the amount of impurities contained in PPS may be controlled.

It is possible to use commercially available PPS having a crystallization temperature during cooling of 230° C. or more.

As the flat glass fiber, a fiber of which the shape of a cross section which is vertical to the longitudinal direction of the fiber has the major axis and the shorter axis can be used. That is, a fiber of which the cross-sectional shape is not circular, but ellipsoidal, approximate rectangular or the like, can be used. Specifically, it is preferred that the ratio of the shorter axis (D1) to the major axis (D2) (D1/D2: oblateness) be ½ to ¹⁄₁₀.

As for the flat glass fiber, a fiber which is commercially available can be used without problems.

It is also possible to add an inorganic filler to the resin composition of the invention. By the addition of an inorganic filler, anisotropy of modulus of elasticity, linear coefficient of expansion or the like of a material can be suppressed.

As the inorganic filler, it is preferable to use a filler in any of the shapes selected from amorphous, spherical and plate-like shapes. For example, carbon black, calcium carbonate, silicates such as melted or crystalline silica, quartz powder, glass beads, glass powder, calcium silicate, aluminum silicate, kaoline, talc, clay, diatomaceous earth and wollastonite, metal oxides such as iron oxide, titanium oxide, zinc oxide and alumina, metal carbonates such as magnesium carbonate, a metal sulfate such as calcium sulfate and barium sulfate, silicon carbide, boron nitride, and various metal powder can be given.

As the plate-like filler, mica, glass flake, various metal foil or the like can be given.

These fillers may be used alone in combination of two or more.

In the resin composition of the invention, it is preferred that the flat glass fiber be contained in an amount of 10 to 200 parts by mass relative to 100 parts by mass of the thermoplastic resin. Furthermore, it is preferred that an inorganic filler be contained in an amount of 200 parts by mass or less.

If the amount of the flat glass fiber is less than 10 parts by mass, the strength may be lowered. If the flat glass fiber is added in an amount exceeding 200 parts by mass, flowability may significantly be lowered, or a material becomes anisotropic, resulting in lowered dimensional stability. It is preferred that the amount of the flat glass fiber be 40 to 100 parts by mass.

If the amount of the inorganic filler exceeds 200 parts by mass, flowability may be significantly lowered or thermal deformation may be caused due to generation of large residual stress in a thin film part or by other reasons. It is particularly preferred that the amount of the inorganic filler be 50 to 200 parts by mass, further preferably 50 to 170 parts by mass.

The resin composition of the invention may essentially consist of a thermoplastic resin excluding a thermoplastic elastomer, a flat glass fiber, and optionally, an inorganic filler. The resin composition of the invention may consist only of these components. The "essentially consist of" as referred to herein means that the above-mentioned composition consist only of a thermoplastic resin excluding a thermoplastic elastomer, a flat glass fiber and optionally, an inorganic filler, and may contain additives which are explained below.

Within a range that the effects of the invention are not impaired, other components may be added. For example, the resin composition of the invention may contain other additives such as an anti-oxidant, a heat stabilizer, a lubricant, a colorant, a plasticizer, a conductivity-imparting agent.

The electronic tag of the invention is obtained by encapsulating an electronic tag inlet with the above-mentioned resin composition for encapsulating an electronic tag.

There are no specific restrictions on the method for producing an electronic tag, and known molding methods can be used. For example, insert molding by injecting molding is preferable.

In the invention, it is preferable to use a production method in which a resin composition for encapsulating an electronic tag is molded to form a primary molded product (primary molding), an electronic tag inlet is combined with this primary molded product, and further, the electronic tag inlet is encapsulated with the resin composition for encapsulating an electronic tag (secondary molding). When the resin composition for encapsulating an electronic tag of the invention is used, if an electronic tag is produced by two-stage molding such as insert molding, a highly reliable electronic tag can be obtained due to good adhesiveness between a primary molded product and a secondary molded product.

FIG. 1 is a view showing one embodiment of an electronic tag of the invention, in which (a) is a top view and a cross-sectional view of an inlet 10; (b) is a top view and a cross-sectional view of a primary molded product 20; and (c) is a top view and a cross-sectional view of a finished electronic tag (secondary molded product 30).

In the method of the invention, first, a stand-like primary molded product on which an inlet is installed is produced by injection molding or the like. In this example, in the primary molded product, a dent having a size corresponding to the inlet is provided. The primary molded product can be obtained by ordinary injection molding or the like.

Next, an inlet is placed on the dent of the primary molded product. Thereafter, the combination of the primary molded product and the inlet is encapsulated with the resin composition for encapsulating an electronic tag. For positioning an inlet, other methods than using a dent may be used.

This process can be performed by installing an inlet on a primary molded product obtained by insert molding by injection molding, fixing the resultant in a mold of injection molding and injecting the resin composition in the mold.

Although the resin composition used in the primary molding and the resin composition used in the secondary molding may be either the same or different, in respect of adhesion between the primary molded product and the encapsulating material, it is preferred that the resin composition used in the primary molding and the resin composition in the secondary molding be the same.

As for the inlet, those commonly used in this technical field can be used without problems. For example, it is possible to use one which is obtained by arranging an IC on a film substrate of, for example, polyethylene terephthalate, a glass epoxy substrate or the like, installing an IC chip and electrically connecting them. As for the shape of the inlet, the inlet may have conventional shapes. For example, a card-like inlet, a label-like inlet, or the like may be used.

EXAMPLES

The materials used in Examples and Comparative Examples are as follows.
(1) PPS PPS-1 and PPS-2 which had been synthesized in Synthesis Examples 1 and 2, which are mentioned later, were used.
(2) SPS
XAREC 300ZC, syndiotactic polystyrene manufactured by Idemitsu Kosan, Co., Ltd, was used.
(3) Flat Glass Fiber
Flat GF, CSG 3PA-830S with an oblateness of ¼ (short axis 7 μm/major axis 28 μm), manufactured by Nitto Boseki Co., Ltd., was used.
(4) Glass Fiber (Circular Cross Section: Oblateness=1/1)
CS 03 JAFT591, chopped GF manufactured by Owens-Corning Corporation, was used.
(5) Calcium Carbonate
P-30, calcium carbonate heavy manufactured by Shiraishi Kogyo Kabushiki Kaisha, was used.
(6) Thermoplastic Elastomer
Bond Fast E, an ethylene-glycidyl dimethacrylate copolymer (E-GMA) manufactured by Sumitomo Chemical Co. Ltd., was used.

Synthesis Example 1 [Synthesis of PPS-1]

In a polymerization vessel provided with a stirrer, 833 moles of hydrous sodium sulfate ($Na_2S \cdot 5H_2O$), 830 moles of lithium chloride and 500 liters of N-methyl-2-pyrrolidone were put The resulting mixture was retained at 145° C. under a reduced pressure to conduct dehydration treatment for one hour. Subsequently, after cooling the reaction system to 45° C., 905 moles of dichlorobenzene were added, followed by polymerization at 260° C. for 4 hours. The resulting product was washed five times with hot water, once with N-methyl-2-pyrrolidone of 170° C., three times with water, and then dried at 185° C. to obtain a polyphenylene sulfide resin (PPS-1). The melt viscosity of this resin was 40 Pa·s at 300° C. at a shear speed of 200 $sec^{-1}$.

Synthesis Example 2 [Synthesis of PPS-2]

A polyphenylene sulfide resin (PPS-2) was prepared in the same manner as in the above-mentioned Synthesis Example 1, except that the number of times of washing the resulting product with hot water was changed from 5 to 1. The melt viscosity of this resin was 40 Pa·s at 300° C. at a shear speed of 200 $sec^{-1}$.

Examples 1 to 4 and Comparative Examples 1 to 5

Each component was uniformly mixed by means of a Henschel mixer at an amount ratio shown in Table 1. Thereafter, the mixture was melt-kneaded by means of a biaxial extruder (TEM35: manufactured by Toshiba Kikai Kabushiki Kaisha). The cylinder temperature of this extruder was set to 280 to 350° C. and melt kneading was conducted, whereby resin composition pellets were produced.
Evaluation of Physical Properties of the Resin Composition
(1) Crystallization Temperature During Cooling of the Resin Composition The sample was heated to 340° C. at a rate of 20° C. per minute. After allowing the sample to stand at 340° C. for 5 minutes, a temperature at which a crystallization peak appeared was measured by means of DSC at a cooling rate of −20° C. per minute.

As a result, it was found that the crystallization temperature during cooling of the composition in Example 1 was 231° C. The crystallization temperature during cooling of the composition in Example 2 was 229° C.
(2) Warpage The resin composition pellets prepared in each Example were molded to form a primary molded product shown in FIG. 1(b) by means of an injection molding machine.

As the injection molding machine, a 50 ton-vertical injection molding machine (manufactured by Sumitomo Heavy Industries, Ltd.) was used. The resin temperature and the mold temperature were 330° C. and 150° C., respectively.

As for the dimension of the primary molded product, the width was about 14 mm, the length was about 70 mm, the thickness was about 2 mm and the wall thickness was about 1 mm.

As the model sample of the inlet, a glass epoxy substrate was used. The glass epoxy substrate was embedded in the dent of the primary molded product, and the resultant was installed within a mold of injection molding, followed by insert molding to obtain a molded product shown in FIG. 1 (c). The molding conditions were the same as those as mentioned above.

As for the dimension of the glass epoxy substrate, the width was about 10 mm, the length was about 67 mm and the thickness was about 1 mm. As for the dimension of the final molded product (secondary molded product), the width was about 14 mm, the length was about 71 mm and the thickness was about 3 mm (the thickness of the resin was about 1 mm).

For this final molded product, the shape of the surface of the molded product was measured by means of a three coordinate measuring machine. The difference in height between the end position and the maximum displacement point was measured to evaluate warpage.

The results are shown in Table 1.

(3) Red Ink Infiltration Test

As for the final molded product produced in (1) above, a red ink filtration test was conducted to judge adhesiveness between the resin composition of the primary molding and the resin composition of the secondary molding. Specifically, the molded product immediately after the molding was immersed in red ink manufactured by Pilot Corporation, and heated at 98° C. for 3 hours. Thereafter, the molded product was taken out, the encapsulating material made of the resin composition was opened, and infiltration of the red ink to the inside (glass epoxy substrate) was visually judged.

The same test as mentioned above was conducted for a molded product which was subjected to 200 cycles of a heat shock test at −40° C. for 30 minutes and 120° C. for 30 minutes, immersed in red ink, and heated at 98° C. for 3 hours, whereby infiltration of the red ink was judged. The number of the sample was 10, and the sample to which no red ink was infiltrated was regarded as a good product, and evaluated in respect of a good product ratio.

The results are shown in Table 1.

(4) Reliability Evaluation

A secondary molded product was obtained in the same manner as in (1) mentioned above. The molded product was subjected to 200 cycles of a heat shock test at −40° C. for 30 minutes and 120° C. for 30 minutes, and evaluated for the formation of cracks in the resin by means of a soft X-ray transmission observation apparatus.

The number of the sample was 10, and the sample to which no red ink was infiltrated was regarded as a good product, and evaluated in respect of a good product ratio.

The results are shown in Table 1.

The invention claimed is:

1. A resin composition which comprises a thermoplastic resin and a flat glass fiber and does not comprise a thermoplastic elastomer, wherein the thermoplastic resin is polyphenylene sulfide and the crystallization temperature during cooling thereof measured by differential scanning calorimetry (DSC) is 230° C. -240° C.

2. The resin composition according to claim 1, comprising 100 parts by mass of the thermoplastic resin, 10 to 200 parts by mass of the flat glass fiber and further comprising 0 to 200 parts by mass of an inorganic filler.

3. The resin composition according to claim 1, wherein the oblateness (the short axis/the major axis of a cross section) of the flat glass fiber is ½ to ¹⁄₁₀.

4. The resin composition according to claim 2, wherein the inorganic filler is at least one of calcium carbonate, mica, talc and silica and is present in 50 to 200 parts by mass.

5. An electronic tag which comprises the resin composition according to claim 1 and an electronic tag inlet.

6. A method for producing an electronic tag comprising:
molding the resin composition according to claim 1 to form a primary molded product;
combining an electronic tag inlet with the primary molded product; and
encapsulating the electronic tag inlet with the resin composition.

7. The resin composition according to claim 2, comprising 100 parts by mass of the thermoplastic resin, 40 to 100 parts by mass of the flat glass fiber, and 50 to 170 parts by mass of an inorganic filler.

8. The resin composition according to claim 7, wherein the oblateness (the short axis/the major axis of a cross section) of the flat glass fiber is ½ to ¹⁄₁₀.

TABLE 1

| | | | Examples | | | | Comparative Examples | | | | |
|---|---|---|---|---|---|---|---|---|---|---|---|
| | | | 1 | 2 | 3 | 4 | 1 | 2 | 3 | 4 | 5 |
| Thermoplastic resin | PPS-1 | Parts by mass | 100 | | | 100 | 100 | | 100 | 100 | 100 |
| | PPS-2 | Parts by mass | | 100 | | | | 100 | | | |
| | SPS | Parts by mass | | | 100 | | | | | | |
| Glass fiber | Flat | Parts by mass | 70 | 70 | 70 | 75 | | | | 80 | |
| | Normal | Parts by mass | | | | | 70 | 70 | 75 | | 80 |
| Calcium carbonate | | Parts by mass | | | | 75 | | | 75 | | |
| Thermoplastic elastomer | | Parts by mass | | | | | | | | 20 | 20 |
| Warpage | Immediately after molding | % | 0.2 | 0.2 | 0.25 | 0.15 | 0.35 | 0.44 | 0.3 | 0.48 | 0.48 |
| Red ink infiltration test | Immediately after molding | Number of good products/Total number of samples | 10/10 | 7/10 | 10/10 | 10/10 | 8/10 | 4/10 | 10/10 | 0/10 | 0/10 |
| | After HS | Number of good products/Total number of samples | 10/10 | 5/10 | 10/10 | 10/10 | 6/10 | 0/10 | 10/10 | — | — |
| Reliability | After HS | Number of good products/Total number of samples | 10/10 | 10/10 | 10/10 | 10/10 | 5/10 | 5/10 | Cracked during molding | — | — |

*HS: Heat shock test

Industrial Applicability

The resin composition for encapsulating an electronic tag of the invention is suitable as a material for forming a sheath (encapsulating part) of an electronic tag.

The electronic tag of the invention can be used in various fields including product management in physical distribution, production management in production sites and inventory management.

9. The resin composition according to claim 8, wherein the inorganic filler is at least one of calcium carbonate, mica, talc and silica.

10. The resin composition according to claim 1, comprising 100 parts by mass of the thermoplastic resin, 40 to 100 parts by mass of the flat glass fiber and further comprising 50 to 200 parts by mass of an inorganic filler.

11. The resin composition according to claim 10, comprising 50 to 170 parts by mass of said inorganic filler.

12. The resin composition according to claim 4, wherein the inorganic filler is calcium carbonate.

13. The resin composition according to claim 7, wherein the inorganic filler is calcium carbonate.

14. The resin composition according to claim 10, wherein the inorganic filler is calcium carbonate.

15. The resin composition according to claim 11, wherein the inorganic filler is calcium carbonate.

* * * * *